United States Patent
Kurz

(10) Patent No.: US 7,583,944 B2
(45) Date of Patent: Sep. 1, 2009

(54) DEMODULATION AND REGULATION CONCEPT FOR IR RECEIVERS

(75) Inventor: Alexander Kurz, Schwaebisch Hall (DE)

(73) Assignee: ATMEL Germany GmbH, Heilbronn (DE)

( * ) Notice: Subject to any disclaimer, the term of this patent is extended or adjusted under 35 U.S.C. 154(b) by 510 days.

(21) Appl. No.: 11/399,570

(22) Filed: Apr. 7, 2006

(65) Prior Publication Data

US 2006/0226900 A1  Oct. 12, 2006

(30) Foreign Application Priority Data

Apr. 7, 2005 (DE) ........................ 10 2005 017 004

(51) Int. Cl.
*H04B 1/06* (2006.01)
(52) U.S. Cl. ................. 455/240.1; 455/150.2; 455/339; 455/341
(58) Field of Classification Search ................. 455/131, 455/150.1, 150.2, 230, 234.1, 240.1, 250.1, 455/334, 338, 339, 340, 341
See application file for complete search history.

(56) References Cited

U.S. PATENT DOCUMENTS

| 3,789,134 | A | * | 1/1974 | Ivas et al. ................... 348/644 |
| 4,339,728 | A | | 7/1982 | Monticelli |
| 5,999,574 | A | * | 12/1999 | Sun et al. .................... 375/326 |
| 6,215,335 | B1 | * | 4/2001 | Rabii .......................... 327/74 |
| 2003/0171108 | A1 | * | 9/2003 | Eichin et al. ................ 455/307 |

FOREIGN PATENT DOCUMENTS

JP   2003-152649 A   5/2003

* cited by examiner

*Primary Examiner*—Nhan T Le
(74) *Attorney, Agent, or Firm*—Muncy, Geissler, Olds & Lowe, PLLC

(57) ABSTRACT

A method and circuit for amplifying and demodulating amplitude-modulated signals is disclosed that amplifies a primary signal into an amplified signal, bandpass filters the amplified signal into a filtered signal, compares the filtered signal with a regulation threshold and regulates the gain of the primary signal such that peak values of the filtered signal approach the regulation threshold, compares the filtered signal with a signal threshold, and demodulates the result of the comparison. Whereby a value of the signal threshold is smaller than a value of the regulation threshold.

12 Claims, 2 Drawing Sheets

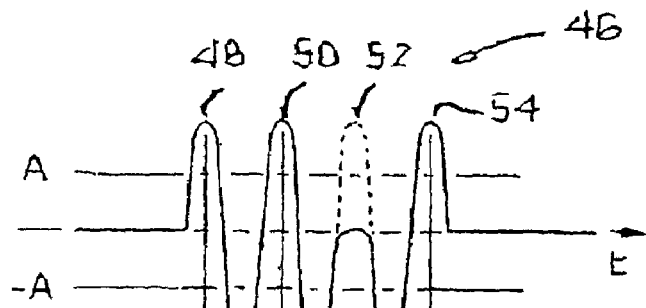
FIG. 4a
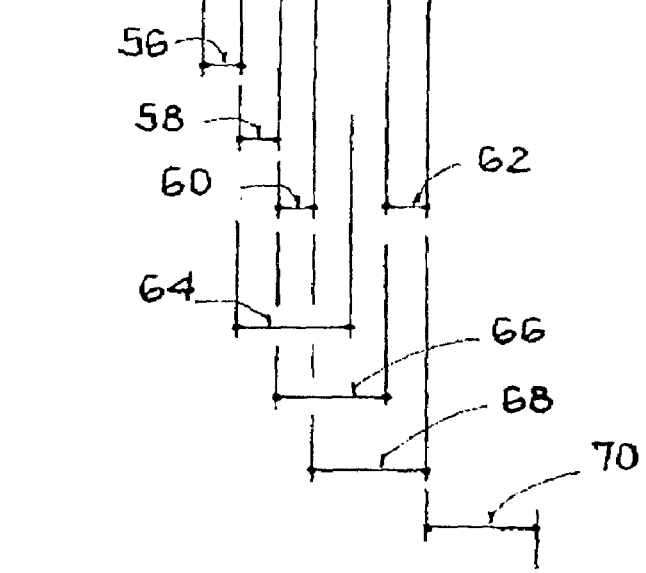
FIG. 4b
FIG. 4c
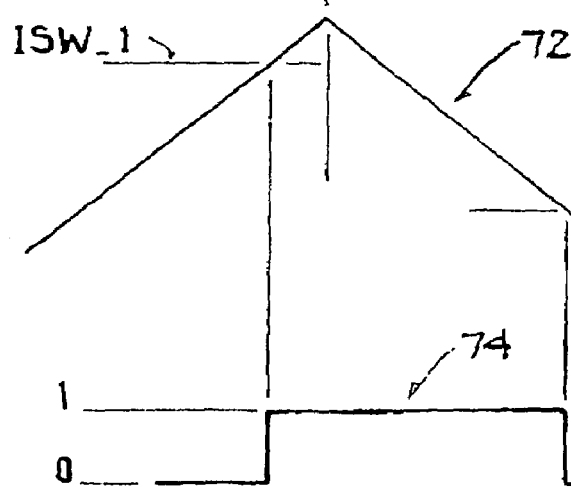
FIG. 4d
FIG. 4e

DEMODULATION AND REGULATION CONCEPT FOR IR RECEIVERS

This nonprovisional application claims priority under 35 U.S.C. § 119(a) on German Patent Application No. DE 102005017004, which was filed in Germany on Apr. 7, 2005, and which is herein incorporated by reference.

BACKGROUND OF THE INVENTION

1. Field of the Invention

The present invention relates to a method for amplifying and demodulating amplitude-modulated signals that includes the steps of: amplification of a primary signal into an amplified signal, bandpass filtering of the amplified signal into a filtered signal, comparison of the filtered signal with a regulation threshold and regulation of the gain of the primary signal such that peak values of the filtered signal approach the regulation threshold, and comparison of the filtered signal with a signal threshold and demodulation of the result of the comparison.

In its device aspect, the invention relates to a circuit for processing amplitude-modulated signals, having an amplifier that creates an amplified signal from a primary signal, having a bandpass filter that creates a filtered signal from the amplified signal, having a regulation comparator that compares the filtered signal with a regulation threshold, having a regulator that regulates a gain of the amplifier such that peak values of the filtered signal approach the regulation threshold, having a signal comparator that compares the filtered signal with a signal threshold, and having a demodulator that demodulates the result of the comparison.

2. Description of the Background Art

Infrared (IR) receiver modules, in particular, typically have a monolithic circuit and an external photodiode. A received infrared signal is amplified, filtered, demodulated and provided at an output as an electrical signal. As a result of the internally provided regulation, the circuit is adapted to ambient conditions. The ambient conditions are affected by such factors as the brightness of the surroundings, in some cases by interfering radiation in the IR frequency range from neon tubes, and the proximity of a data transmitter. Typical data transmitters include, for example, mobile parts of a TV remote control. In the prior art regulation, the signal threshold is greater than the regulation threshold.

For example, data protocols with high data rates and short burst spacings in the protocol frequently cause the threshold value to be exceeded, which then reduces the gain. As a result, it is possible that the smaller signal threshold will no longer be reached. Consequently, these data protocols are thus interpreted as noise to some extent, and suppressed.

Under some circumstances, an approaching data transmitter with a high data rate can cause a similar reaction in the regulation. Here, too, the data from the data transmitter can no longer be demodulated because the regulation triggered by the regulating threshold interprets the data transmitter as an interference source and reduces the gain of the system.

Moreover, the prior art regulating methods are relatively sluggish, so that the output signal of the circuit has undesirably large variation (jitter, output pulse dispersion) with widely varying input data signal strength. For example, the input data signal strength in typical commercial IR remote controls can vary because they are designed to be usable over distances between one centimeter and approximately 35 meters; with their constant radiated power, this results in the aforementioned significant variations in signal strength at the input of the receiver module.

SUMMARY OF THE INVENTION

It is therefore an object of the present invention to provide a method and a circuit with which even data protocols with high data rates and short burst spacings in the protocol are not suppressed, and with which the risk of failure to recognize data of an approaching data transmitter transmitting at a high data rate is reduced, and in which incoming pulses having strongly varying input signal strengths, for example as a result of varying distance from the data transmitter, can be recognized, wherein the output pulse signal amplitudes produced by the method and the circuit can be kept largely constant by rapid adjustment to the input signal strength.

This object is attained in a method of and a circuit, in that a value of a signal threshold is smaller than the value of the regulation threshold.

The advantageous effect of this feature is made clear with the following example. Consider a primary signal with a high data rate, and thus only short intervals between individual bursts (burst=rapid sequence of, e.g., 6 to 30 single pulses) in a noise-free environment. In both the prior art and the invention, the regulation of the gain of the primary signal takes place such that peak values of the filtered signal approach the regulation threshold. In the prior art, this has the result that the signal strength is regulated below the larger signal threshold, so that no data can be derived from the comparison with this threshold. In contrast thereto, according to an embodiment of the present invention, the signal threshold is smaller than the regulation threshold so that the signal threshold is exceeded even when the signal strength has been reduced by the regulation process. In this way, the object described above is attained in full.

In an embodiment, the step of regulating the gain includes a step of an averaging of the peak values.

The averaging produces a low-pass characteristic which stabilizes the regulation.

Further, the step of demodulation can have steps of a digital filtering with discrimination and integration steps.

On account of these features, useful signals can be filtered and demodulated even from a primary signal with noise components. In the general case characterized by a primary signal having noise components, the regulation takes place on all noise and data signals, and the data signals are selected from the noisy signal through the digital filtering and discrimination.

The step of digital filtering and discrimination can include steps of a measurement of time periods of predetermined values of the result of the comparison, steps of a comparison of the measured periods with an interval of permissible values, and steps of a generation of output pulses for periods within the interval.

Useful signal components in the primary signal are characterized by a predefined periodicity, while noise components result in peak values stochastically distributed over a time span. Only peak values with predetermined periods corresponding to the aforementioned periodicity are further processed, which produces an effective separation between signal components and noise components in further signal processing. The digital filtering and discrimination results in a very error-tolerant filtering with low circuit complexity.

Another embodiment provides that output pulses are integrated in integration steps, the integration result is compared with a first integration threshold and/or a second integration threshold, an output signal is set in the event that the first integration threshold is exceeded, and is cleared in the event that the value falls below the second integration threshold.

As a result of this integration taking place in conjunction with a threshold comparison, an image of the envelope curve of the useful signal component in the primary signal can be determined as information content of the useful signal.

The output pulses can be prolonged in a predetermined manner prior to their integration.

As a result, an error tolerance of the signal processing can be increased in a desirable manner because individual pulses of a burst can be absent in the useful signal without causing errors in the envelope curve determined.

In analogous fashion to these embodiments of the method, the regulator can digitally average the peak values in simulation of a rectifying peak detector and provide averaged peak values as control signals for the regulation amplifier, and/or for the demodulator to have a digital filter with a discriminator and an integrator, and/or for the digital filter with the discriminator to determine periods of predefined values of the comparison result and compare the periods with a lower threshold and an upper threshold and generate an output pulse when a period lies between the lower and upper thresholds, and/or for the integrator to integrate the output pulses and for the integrator to set a signal when the integration result exceeds a first integration threshold and to clear the signal when the integration result falls below a second integration threshold, and/or for the integrator to prolong its input pulses prior to integration.

These embodiments of the circuit possess the advantages described for the corresponding combinations of method features.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 4a-e illustrate qualitative signal behaviors in various states of a demodulation.

DETAILED DESCRIPTION

Figure 1:
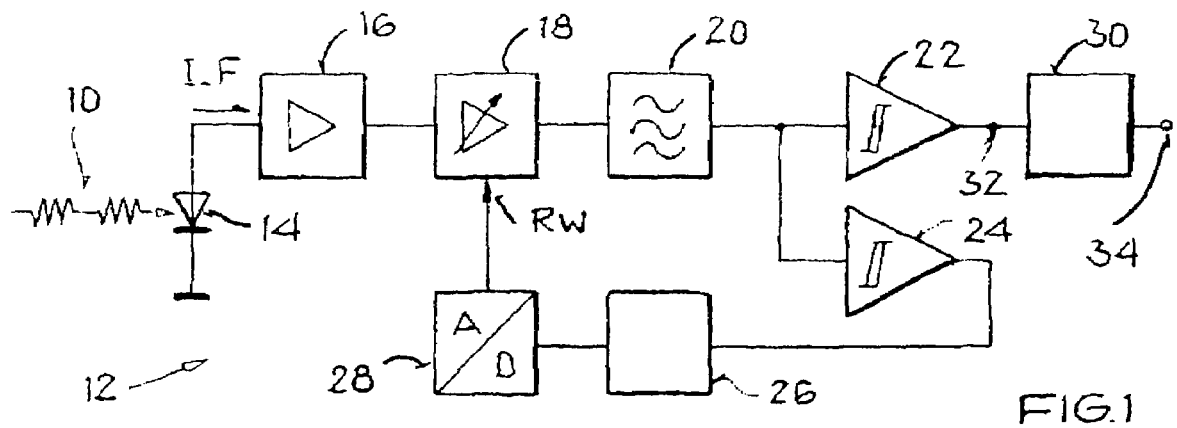
FIG. 1 illustrates a circuit according to an embodiment of the present invention.

FIG. 1 shows data signals 10, which are applied to a circuit 12 as primary electrical signals. For example, the data signals 10 may be infrared signals that are received by a photodiode 14 and converted into a photocurrent I_F as an example of an electrical signal. Typically infrared signals have a carrier frequency between 30 kHz and 80 kHz, and pulse packets (bursts) that have been produced through an amplitude modulation (AM) of 100%. The burst packets include multiple individual pulses.

The alternating input currents I_F of the photodiode 14 are converted into alternating voltages by a transimpedance amplifier 16 and are amplified in a regulation amplifier 18 as a function of a regulation value RW. A bandpass filter 20 is matched to the carrier frequency and ensures a relatively high selectivity of the circuit 12. The bandpass filter 20 thereby implements a prefiltering of the signals with a quality Q, with Q approximately equaling 2 to 3.

Subsequent to the bandpass filtering, the filtered alternating voltage signal is compared with a signal threshold by a signal comparator 22, and is compared with a regulation threshold by a regulation comparator 24. In this regard, the signal threshold is significantly below the regulation threshold. If one assigns a value of 100% to the regulation threshold, the signal threshold is, for example, at +50% and −50%.

A regulator 26 processes an output signal of the regulation comparator 24 into the aforementioned regulation value for the regulation amplifier 18, and in doing so sets a gain of the regulation amplifier 18 such that peak values of the filtered signal, which is to say of the alternating voltage at the output of the bandpass filter 20, take on or at least approach the value of the regulation threshold.

The regulator 26 preferably implements the regulation process on a digital basis, and in doing so simulates a rapid rectifying peak detector with a storage capacitor. This represents an embodiment of an averaging of the peak values of the filtered signal. A digital-to-analog converter 28 converts the digital control variable into an analog regulation value RW, for example, into a control current for the regulation amplifier 18.

Figure 2:
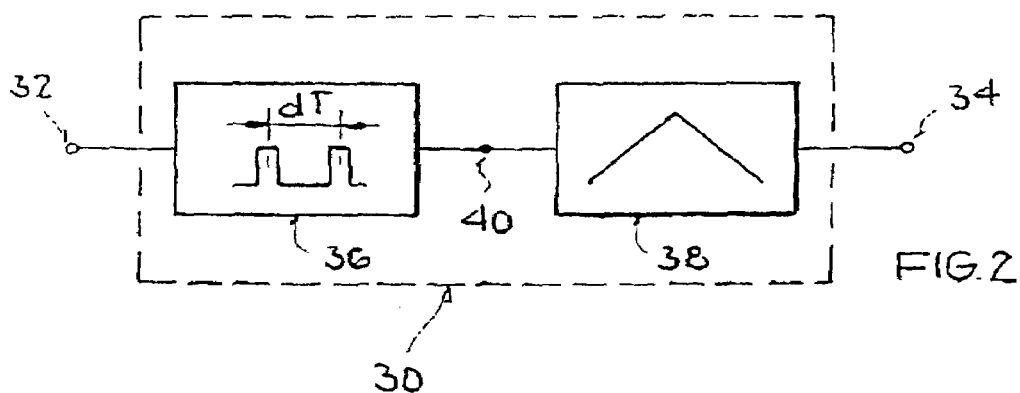
FIG. 2 show details of a demodulator with a digital filtering and discrimination.

From the result of the comparison of the filtered signal to the signal threshold value, a demodulator 30 with an input 32 and an output 34 creates an envelope curve of a useful signal component in the primary signal and provides the envelope curve at its output 34. For this purpose, the demodulator 30 can have the structure shown in FIG. 2 with a block 36 representing a digital filter with a discriminator, and a subsequent analog integrator 38. The block 36 measures the spacing between two signal comparator pulses and selects the pulses whose spacing lies within a time window dT, which corresponds to an interval of permissible periods. To a certain extent, the time window dT represents a capture range that is dependent on the carrier frequency. Via the block 36, a very steep-skirted and error-tolerant filtering of the output signal of the signal comparator 22 is achieved with low circuit complexity. Namely, an output pulse is only generated by the block 36 and transferred to the integrator 38 when a measured spacing lies within this capture range or time window dT. These output pulses are subsequently integrated in the analog integrator 38.

The analog integrator 38 has charge and discharge states. Charging takes place when output pulses from the block 36 are present at its input 40. Discharging takes place in intervals between the output pulses. In an embodiment, the integrator 38 prolongs the output pulses received from the block 36. The prolongation can take place by multiplying the lengths of the output signals of the block 36 by a factor of 1.6, by which the absence of individual pulses is tolerated. In another embodiment, the integration time of the integrator 38 can be set to a certain number of pulse lengths, for example 4 or 7 pulse lengths, as a function of the desired variant. A signal is set at the output 34 of the integrator 38, which is simultaneously the output 34 of the demodulator 30, when the sum of the integrated output pulses, or in other words the integration result, exceeds a first integration threshold, which is, for example, approximately 80% of a dynamic range of the integrator 34.

The setting of the signal thus reproduces the start of a burst in the primary signal. Subsequently, the signal remains set until the integration result reaches a second integration threshold, which corresponds, for example, to a value of 20% of the dynamic range of the integrator 38. A drop below the second integration threshold triggers a clearing of the signal, and thus reproduces the end of a burst. The time behavior of this set and cleared signal thus constitutes a representation of the envelope curve of bursts in the primary signal. The limitation of the integration time of the integrator 38 to a few pulse lengths causes a clearing to occur rapidly, even when, e.g., 30 pulses are integrated.

Figure 3:
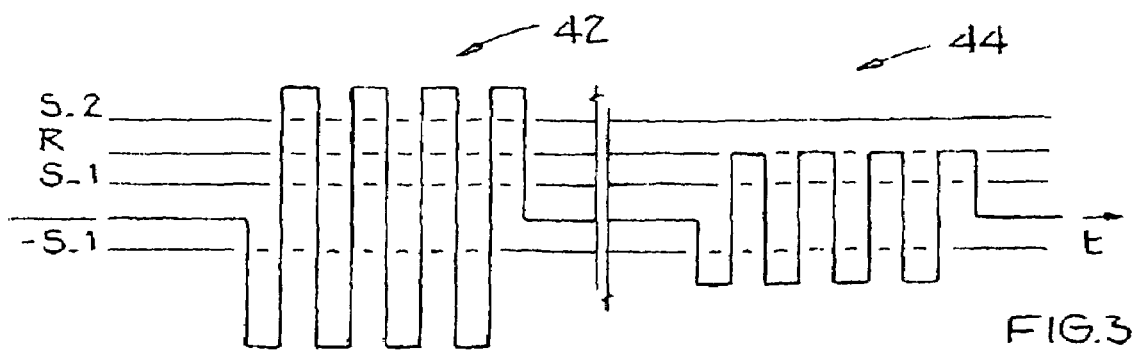
FIG. 3 is a time behavior of bursts in a primary signal before and after a regulation process, together with relative positions of a regulation threshold and different signal thresholds.

FIG. 3 shows qualitative behaviors of bursts 42, 44 in a filtered signal at the input of the regulation comparator 24 from FIG. 1 before and after a regulation process together with relative positions of a regulation threshold R and signal thresholds S_1, −S_1, S_2. In this context, the burst 42 corresponds to a state before a regulation process, such as occurs when a data transmitter is switched on in the vicinity of an IR receiver, for example. The amplitudes of the burst 42 are so high that they exceed the regulation threshold R. The circuit 12 then reduces the gain sufficiently that the peak values of the filtered signal at the input of the regulation comparator 24 take on the value of the regulation threshold R, as is the case with the burst 44. The signal threshold value S_1, −S_1 used within the scope of the present invention is smaller than the regulation threshold R, so that even the individual pulses of the burst 44 are detected with the regulation in its steady state. In contrast, the regulation threshold S_2 used in the prior art is so large that the individual pulses in the burst 44 are no longer detected.

FIG. 4 shows qualitative signal behaviors in various stages of a demodulation, in each case over the time t. The pulse train 46 from FIG. 4a qualitatively represents a result of the comparison of the bandpass-filtered signal with threshold values +/−S_1 and is present at the input of the block 36 from FIG. 2. The result depicted has three pulses 48, 50, 54, wherein a single pulse 52 shown in dashed lines should per se be present, but is missing due to an error of the transmitter or receiver.

The block 36 measures the periods of predetermined values of the comparison result, where the values exceed or fall below a minimum amplitude +/−A. For example, the period 56, 58, 60, 62 can be measured in each case in which a minimum follows a maximum, or a maximum follows a minimum. These periods are represented in FIG. 4b. For each period 56, 58, 60, 62 that lies within the time window dT, a pulse 64, 66, 68, 70 of predetermined length is generated, which is preferably greater than the period of the pulse sequence 46. In one embodiment, a prolongation factor has the value 1.6, so that the absence of the individual pulse 52 is compensated in the superposition of the generated pulses. Alternatively, pulses with the length of the periods can also be generated initially and can then be prolonged by an appropriately adjusted factor. The lengths 64, 66, 68, 70 of the prolonged pulses are shown in FIG. 4c.

Subsequently, an integration of the superimposed lengths or pulses 64, 66, 68, 70 by the integrator 38 takes place. The resulting value 72 of the integral is shown in FIG. 4d. At the output 34 of the integrator 38, a signal 74 is set to a predefined value (for example, a logic 1) when the integration result 72 exceeds a first integration threshold ISW_1, and is cleared (for example, to a logic 0) when the integration result drops below a second integration threshold ISW_2. The first threshold ISW_1 can, for example, be at 80% of the dynamic range of the integrator, and the second threshold ISW_2 can, for example, be at 20% of the dynamic range. The behavior of the signal 74 at the output of the integrator thus constitutes a representation of the envelope curve of the pulses 48, 50, 52, 54 of a burst 46.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for amplifying and demodulating amplitude-modulated signals, the method comprising the steps of:
    amplifying a primary signal into an amplified signal;
    bandpass filtering of the amplified signal into a filtered signal;
    comparing the filtered signal with a regulation threshold;
    regulating a gain of the primary signal such that peak values of the filtered signal approach the regulation threshold;
    comparing the filtered signal with a signal threshold, a value of the signal threshold being smaller than a value of the regulation threshold; and
    demodulating a result of the comparison.

2. The method according to claim 1, wherein the step of regulating the gain further includes, a step of an averaging of the peak values.

3. The method according to claim 1, wherein the step of demodulation further includes digital filtering with discrimination and integration steps.

4. The method according to claim 3, wherein the step of digital filtering and discrimination includes steps of measuring time periods of predetermined values of the comparison result, steps of a comparing the measured periods with an interval of permissible values, and steps of a generating output pulses for periods within an interval.

5. The method according to claim 4, wherein the output pulses are integrated in the integration steps, the integration result is compared with a first integration threshold and/or a second integration threshold, an output signal is set in an event that the first integration threshold is exceeded and is cleared in an event that a value thereof falls below the second integration threshold.

6. The method according to claim 5, wherein the output pulses are prolonged in a predefined fashion prior to their integration.

7. A circuit for processing amplitude-modulated signals, the circuit comprising:
    an amplifier that provides an amplified signal from a primary signal;
    a bandpass filter that provides a filtered signal from the amplified signal;
    a regulation comparator that compares the filtered signal with a regulation threshold;
    a regulator that regulates a gain of the amplifier such that peak values of the filtered signal approach the regulation threshold;
    a signal comparator that compares the filtered signal with a signal threshold a value of the signal threshold being smaller than a value of the regulation threshold; and
    a demodulator that demodulates a result of the comparison.

8. The circuit according to claim 7, wherein the regulator digitally averages the peak values in simulation of a rectifying peak detector and provides the averaged peak values as control signals for the amplifier.

9. The circuit according to claim 7, wherein the demodulator includes a digital filter with a discriminator and an integrator.

10. The circuit according to claim 9, wherein the digital filter with the discriminator determines periods of predefined values of the comparison result and compares them with a lower threshold and an upper threshold and generates an output pulse when a period lies between the lower and upper thresholds.

11. The circuit according to claim 10, wherein the integrator integrates the output pulses, and wherein the integrator sets a signal when the integration result exceeds a first integration threshold and clears the signal when the integration result falls below a second integration threshold.

12. The circuit according to claim 11, wherein the integrator prolongs its input pulses prior to the integration.

* * * * *